US008609474B2

(12) United States Patent
Lim et al.

(10) Patent No.: US 8,609,474 B2
(45) Date of Patent: Dec. 17, 2013

(54) METHOD OF MANUFACTURING SEMICONDUCTOR DEVICE

(75) Inventors: Jong-Won Lim, Daejeon (KR); Hokyun Ahn, Daejeon (KR); Dong Min Kang, Daejeon (KR); Woojin Chang, Daejeon (KR); Hae Cheon Kim, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 25 days.

(21) Appl. No.: 13/274,367

(22) Filed: Oct. 17, 2011

(65) Prior Publication Data

US 2012/0146107 A1    Jun. 14, 2012

(30) Foreign Application Priority Data

Dec. 14, 2010   (KR) .......................... 10-2010-0127661

(51) Int. Cl.
*H01L 29/772*   (2006.01)
*H01L 21/28*    (2006.01)
*H01L 29/423*   (2006.01)
*H01L 29/40*    (2006.01)

(52) U.S. Cl.
CPC ......... H01L 29/42376 (2013.01); *H01L 29/402* (2013.01); *H01L 29/40* (2013.01)
USPC ............ 438/140; 438/454; 438/585; 257/288

(58) Field of Classification Search
CPC .............. H01L 29/402; H01L 29/0603; H01L 29/7781; H01L 29/42316; H01L 21/0272; H01L 29/42384; H01L 29/7787

USPC ......................................... 438/140, 454, 574
See application file for complete search history.

(56) References Cited

U.S. PATENT DOCUMENTS

| 4,459,823 | A | * | 7/1984 | Josephs et al. ................... 62/268 |
| 7,573,078 | B2 | | 8/2009 | Wu et al. |
| 7,662,698 | B2 | | 2/2010 | Tabatabaie |
| 2003/0183844 | A1 | * | 10/2003 | Yokoyama et al. ........... 257/192 |
| 2006/0043416 | A1 | * | 3/2006 | Li et al. .......................... 257/192 |
| 2006/0183325 | A1 | * | 8/2006 | Franosch et al. .............. 438/670 |
| 2010/0276698 | A1 | * | 11/2010 | Moore et al. ..................... 257/76 |
| 2011/0143505 | A1 | * | 6/2011 | Ahn et al. ...................... 438/186 |

FOREIGN PATENT DOCUMENTS

| JP | 2004-281926 A | 10/2004 |
| KR | 10-0614240 B1 | 8/2006 |
| KR | 10-0857683 B1 | 9/2008 |

* cited by examiner

*Primary Examiner* — Tom Thomas
*Assistant Examiner* — John Bodnar
(74) *Attorney, Agent, or Firm* — Rabin & Berdo, P.C.

(57) ABSTRACT

Disclosed are a semiconductor device and a method of manufacturing the same. In the semiconductor device according to an exemplary embodiment of the present disclosure, at the time of forming a source electrode, a drain electrode, a field plate electrode, and a gate electrode on a substrate having a heterojunction structure such as AlGaN/GaN, the field plate electrode made of the same metal as the gate electrode is formed on the side surface of a second support part positioned below a head part of the gate electrode so as to prevent the gate electrode from collapsing and improve high-frequency and high-voltage characteristic of the semiconductor device.

6 Claims, 4 Drawing Sheets

METHOD OF MANUFACTURING SEMICONDUCTOR DEVICE

CROSS-REFERENCE TO RELATED APPLICATIONS

This application is based on and claims priority from Korean Patent Application No. 10-2010-0127661, filed on Dec. 14, 2010, with the Korean Intellectual Property Office, the present disclosure of which is incorporated herein in its entirety by reference.

TECHNICAL FIELD

The present disclosure relates to a semiconductor device (for example, a nitride field effect transistor) capable of showing high voltage and high power properties and a method of manufacturing the same.

BACKGROUND

Since a nitride (GaN) semiconductor device, specifically, a nitride field effect transistor, is a direct transition type semiconductor device and has a high electron moving speed ($2\times10^7$ cm/s) and a high breakdown field ($3\times10^6$ V/cm), the nitride field effect transistor is attractive as a new high-frequency electronic device. Further, since the nitride field effect transistor can be implemented in a heterojunction structure such as AlGaN/GaN and can be selectively doped, the nitride field effect transistor can be designed in an optimal structure for high speeds. The nitride field effect transistor is coming up as a new semiconductor device having high voltage and high frequency properties by significantly improving a trade-off relationship between a cut-off frequency $f_t$ and a breakdown voltage $V_{BV}$ which were problematic in a field effect transistor in the related art.

When the nitride field effect transistor (FET) having high power density in addition to the high voltage and high frequency properties is used, peripheral circuits, such as a power distributing and combining circuit and a DC voltage converting circuit, can be removed or simplified, and as a result, a high power amplifier module having can be configured.

Meanwhile, for the high-speed nitride field effect transistor, a T-gate, a Y-gate, or a mushroom-gate electrode having a large cross-sectional area is essentially used to improve noise property by reducing high modulation operation and gate resistance. The T-, Y-, and mushroom-gate electrodes are generally formed through an electronic beam lithography method or a photolithography method. Since resolution deteriorates while minutely forming a critical dimension of the gate electrode using the photolithography method, the electronic beam lithography method is more used, in which a photoresist film of a double layer or a triple layer is generally used.

The nitride field effect transistor will be described below in detail with reference to FIG. 1.

FIG. 1 shows a nitride field effect transistor having a field plate electrode in the related art. The nitride field effect transistor in the related art includes a source electrode 120 and a drain electrode 130 that are spaced apart from each other on a AlGaN/GaN heterojunction epiwafer 110; a passivation layer 140 formed on epiwafer 110 between source electrode 120 and drain electrode 130 and including a contact hole; a gate electrode 150 connected with epiwafer 110 through the contact hole formed in passivation layer 140; a first field plate electrode 160 formed on passivation layer 140 to connect gate electrode 150; and a second field plate electrode 170 formed on passivation layer 140 to be spaced apart from first field plate electrode 160.

However, in the field plate electrode structure in the related art, since first field plate electrode 160 is also formed simultaneously while forming gate electrode 150, it is difficult to manufacture a gate electrode having a minute pattern width and it is problematic in connecting the gate electrode and the field plate electrode to each other, and as a result, the gate electrode may collapse, thereby deteriorating transistor property. Further, the spacing distance between first field plate electrode 160 and second field plate electrode 170 needs to be adjusted and since first field plate electrode 160 and second field plate electrode 170 are formed by an image reversal process, the adjusted spacing distance may vary, such that the performance of the transistor may be problematic.

SUMMARY

The present disclosure has been made in an effort to provide a semiconductor device and a method for manufacturing the same that can improve a breakdown voltage and high frequency properties by using a field plate electrode as well as forming a gate electrode having a minute pattern width.

An exemplary embodiment of the present disclosure provides a semiconductor device including: a substrate; a source electrode and a drain electrode formed on the substrate to be spaced apart from each other; an insulating film formed on the substrate, and the source electrode and the drain electrode; a field plate electrode formed on the insulating film; and a gate electrode formed to contact the field plate electrode, wherein the gate electrode includes, a first support part fixed to a dry-etched portion of the insulating film; a second support part connected with the first support part and formed to contact the field plate electrode; and a head part formed to connect the second support part, and the width W3 of the second support part is larger than the width W2 of the first support part.

Another exemplary embodiment of the present disclosure provides a method for manufacturing a semiconductor device, including: a) forming a source electrode and a drain electrode on a substrate; b) forming an insulating film by depositing silicon oxide or silicon nitride on the substrate with the source electrode and the drain electrode; c) forming a field plate electrode on the insulating film; and d) forming a gate electrode so that a second support part and the field plate electrode contact each other by dry-etching the insulating film to form an outer profile of a first support part and forming outer profiles of the second support part and a head part with a first photoresist film of a triple layer and thereafter, vacuum-depositing the outer profiles using electron beams.

The forming of the field plate electrode may include: c-1) applying a second photoresist film of a single layer on the insulating film; c-2) exposing a part of the insulating film by removing the second photoresist film as much as the width of a field plate electrode to be formed; c-3) depositing a field plate electrode metal on the exposed portion of the insulating film and an unremoved second photoresist film; and c-4) removing the unremoved second photoresist film and the field plate electrode metal deposited thereon.

The forming of the gate electrode may include: d-1) applying a third photoresist film of a single layer on the insulating film with the field plate electrode; d-2) developing the third photoresist film and etching the insulating film using the developed third photoresist film as a mask so as to expose a part of each of the insulating film and the field plate electrode; d-3) forming the outer profile of a first support part by removing an unetched portion of the third photoresist film; d-4) applying the first photoresist film of the triple layer onto the insulating film where the outer profile of the first support part is formed; d-5) forming the outer profiles of the second support part and the head part connected with the first support part by removing a part of the first photoresist film; and d-6) vacuum-depositing the outer profiles of the first support part, the second support part, and the head part with the electron beams and removing an unremoved portion of the first photoresist film.

According to exemplary embodiments of the present disclosure, the safety of the gate electrode can be improved by using an insulating film composed of a silicon nitride film or a silicon oxide film and a first support part of the gate electrode is formed by etching the silicon nitride film or silicon oxide film through a dry etching method, and as a result, the gate electrode can have a minute pattern width.

Further, according to exemplary embodiments of the present disclosure, by using a structure in which the field plate is provided on the side of the second support part positioned below the head part of the gate electrode, the gate electrode can be prevented from collapsing and the breakdown voltage is increased by alleviating the field effect that concentrates on the lower edge of the gate electrode to improve the high voltage property of the semiconductor device.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, exemplary embodiments of the present disclosure will be described in detail with reference to the accompanying drawings.

1. Semiconductor Device

The semiconductor device according to the exemplary embodiment of the present disclosure is not particularly limited, but may be a transistor and is preferably a nitride field effect transistor (FET). The semiconductor device according to the exemplary embodiment of the present disclosure will be described below with reference to FIG. 2.

Figure 1:
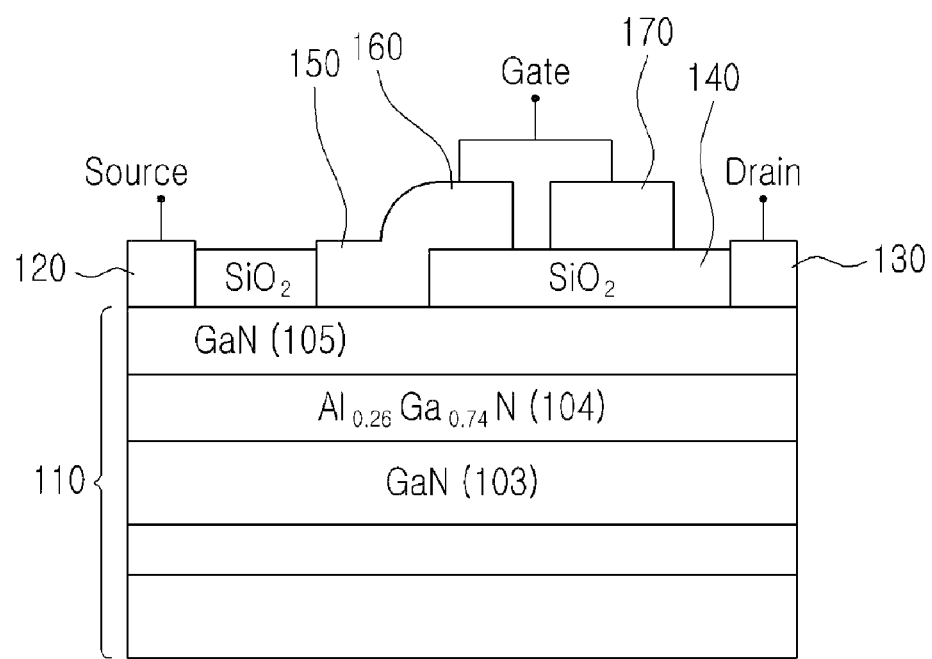
FIG. 1 is a cross-sectional view showing a semiconductor device (field effect transistor) in the related art.
Figure 2:
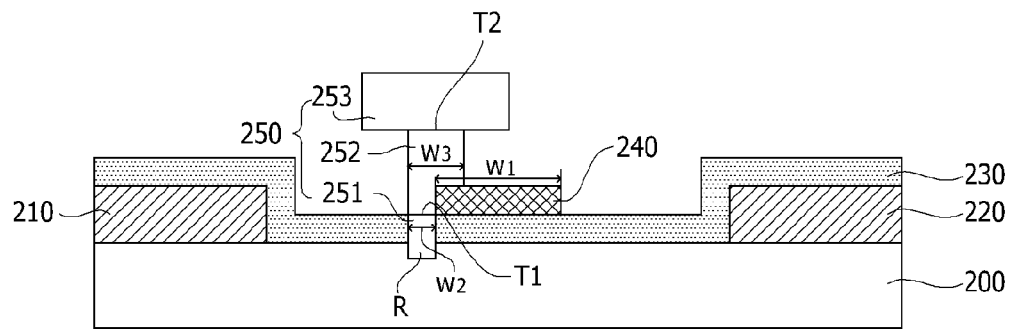
FIG. 2 is a cross-sectional view showing a semiconductor device according to an exemplary embodiment of the present disclosure.

FIG. 2 is a cross-sectional view showing a semiconductor device according to an exemplary embodiment of the present disclosure. The semiconductor device according to the exemplary embodiment of the present disclosure includes a substrate 200, a source electrode 210, a drain electrode 220, an insulating film 230, a field plate electrode 240, and a gate electrode 250.

If substrate 200 has an insulating property, substrate 200 may be used without particular limitation and as an unlimited example, substrate in which an epilayer may be grown on a silicon (Si), silicon carbide (SiC), or sapphire substrate may be used. Further, substrate 200 having high resistivity or doped with an n type or p type may be used.

Source electrode 210 and drain electrode 220 are formed on substrate 200 to be spaced apart from each other for electron movement. As source electrode 210 and drain electrode 220, metal having conductivity may be used without particular limitation and as an unlimited example, an alloy obtained by depositing and rapid thermal processing Ti/Al/Ni/Au may be used.

Insulating film 230, which is formed on substrate 200 with source electrode 210 and drain electrode 220, serves to support and protect gate electrode 250. That is, a first support part 251 of gate electrode 250 to be described below is formed on insulating film 230 to support (fix) gate electrode 250, and as a result, the safety of gate electrode 250 can be ensured. Further, insulating film 230 also serves to protect an active region of the semiconductor device. A material which can be used as the insulating film 230 is not particularly limited, but as an unlimited example, silicon oxide (for example, $SiO_2$) or silicon nitride (for example, $Si_3N_4$) may be used. Herein, first support part 251 of gate electrode 250 is formed by dry-etching insulating film 230. When insulating film 230 is made of silicon oxide or silicon nitride, it is easy to form first support part 251 having a minute pattern width W2. Meanwhile, the thickness of insulating film 230 formed on substrate 200 is not particularly limited, but the thickness may be in the range of 500 to 800 Å so that first support part 251 of gate electrode 250 is stably formed with minute pattern width W2.

Field plate electrode 240, which is formed on insulating film 230, serves to alleviate (distribute) concentration of a field effect on gate electrode 250. Field plate electrode 240 may be composed of Ni/Au and may have a width W1 in the range of 0.5 to 1.5 μm and a thickness in the range of 500 to 3000 Å toward drain electrode 220 on the side of gate electrode 250 in consideration of a breakdown voltage of the semiconductor device.

Gate electrode 250 contacts field plate electrode 240 and gate electrode 250 according to the exemplary embodiment of the present disclosure includes first support part 251, a second support part 252, and a head part 253.

First support part 251 is formed on the dry-etched portion of insulating film 230 so as to fix gate electrode 250 to insulating film 230. In this case, since insulating film 230 is etched to have minute pattern width W2 in the range of 0.1 to 0.25 μm and first support part 251 is formed on the etched portion of insulating film 230, gate electrode 250 according to the exemplary embodiment of the present disclosure also has minute pattern width W2 in the range of 0.1 to 0.25 μm. As described above, since first support part 251 of gate electrode 250 fixed to insulating film 230 according to the exemplary embodiment of the present disclosure is formed to have minute pattern width W2 in the range of 0.1 to 0.25 μm, a cut-off frequency can be improved, and as a result, the high frequency property of the semiconductor device can be improved.

Meanwhile, first support part 251 of gate electrode 250 may be positioned at up to a recess etched portion R on substrate 200 in order to adjust a current so that a desired current flow between source electrode 210 and drain electrode 220 and a description thereof will be described below.

Second support part 252 is connected with the top T1 of first support part 251 and contacts field plate electrode 240. In this case, second support part 252 has a width W3 larger than width W2 of first support part 251 and specifically, may be formed with width W3 in the range of 0.6 to 0.7 µm. Further, second support part 252 may contact the side or a part or the entire part of the side and the top side of field plate electrode 240 in contacting field plate electrode 240. As described above, in the exemplary embodiment of the present disclosure, since second support part 252 of gate electrode 250 has width W3 in the range of 0.6 to 0.7 µm larger than width W2 of first support part 251, the entire area of gate electrode 250 increases, and as a result, the resistance of gate electrode 250 can be reduced. Further, as second support part 252 contacts the side and top side of field plate electrode 240, first support part 251 having minute pattern width W2 can be prevented from collapsing and concentration of the field effect on first support part and second support part 252 can be alleviated.

Head part 253 is connected with the top T2 of second support part 253 and may have a width larger than the width of second support part 253.

First support part 251, second support part 252, and head part 253 of gate electrode 250 described above are integrated with each other and may be composed of Ni/Au. Further, gate electrode 250 according to the exemplary embodiment of the present disclosure is not particularly limited, but may be selected from the T-, Y-, and mushroom-gate electrodes and among them, the T-gate electrode may be used.

2. Method for Manufacturing Semiconductor Device

The exemplary embodiment of the present disclosure provides a method for manufacturing a semiconductor device (for example, a field effect transistor) and the method will be described below in detail with reference to the accompanying drawings.

Figure 3:
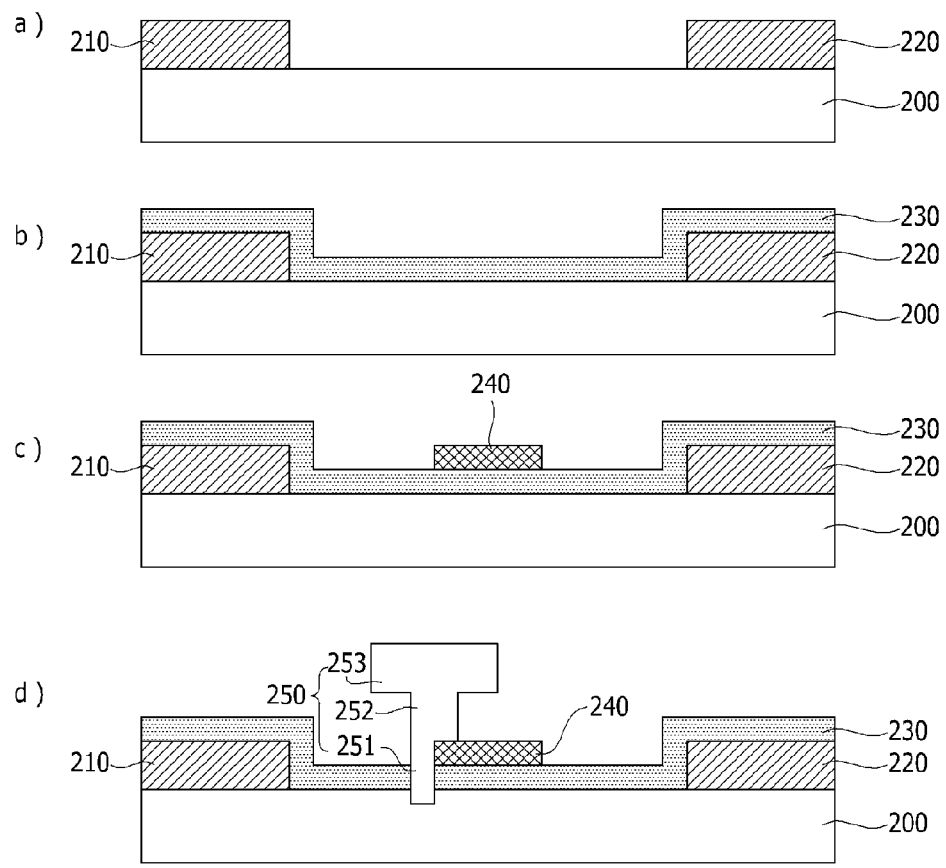
FIG. 3 is a process diagram showing a manufacturing process of a semiconductor device according to an exemplary embodiment of the present disclosure.

FIG. 3 is a process diagram showing a manufacturing process of a semiconductor device according to an exemplary embodiment of the present disclosure. A source electrode 210 and a drain electrode 220 spaced apart from each other are first formed on a prepared substrate 200 in order to manufacture the semiconductor device according to the exemplary embodiment of the present disclosure (see a) of FIG. 3). In this case, as the forming method of source electrode 210 and drain electrode 220, a method known in the art is not particularly limited.

When source electrode 210 and drain electrode 220 are formed on substrate 200, at least one of silicon oxide (for example, $SiO_2$) and silicon nitride (for example, $Si_3N_4$) is deposited to form an insulating film 230 (see b) of FIG. 3). In this case, as the deposition method, a method known in the art is not particularly limited, but plasma enhanced chemical vapor deposition (PECVD) or sputter may be used.

When insulating film 230 is formed, a field plate electrode 240 is formed on insulating film 230 by using a second photoresist film E2 (see c) of FIG. 3) and it will be described below with reference to FIG. 4.

Figure 4:
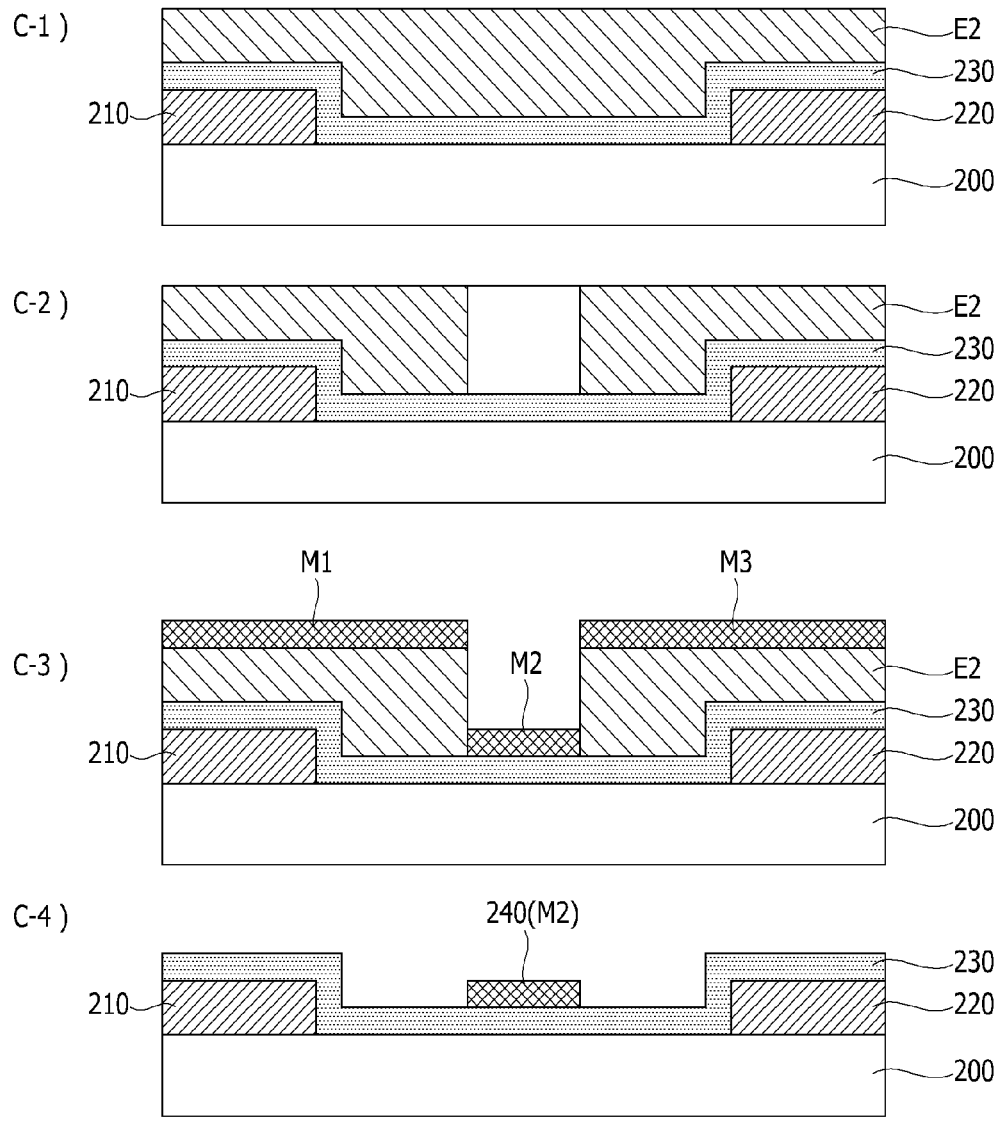
FIG. 4 is a process diagram showing a manufacturing process of a field plate electrode of a semiconductor device according to an exemplary embodiment of the present disclosure.

FIG. 4 is a process diagram showing a manufacturing process of field plate electrode 240 of a semiconductor device according to an exemplary embodiment of the present disclosure. Second photoresist film E2 of a single layer is first applied onto insulating film 230 (see c-1) of FIG. 4). Applied second photoresist film E2 as a shape inverting photoresist film is applied with a thickness of approximately 1.1 to 1.2 µm.

Next, applied second photoresist film E2 is baked and thereafter, second photoresist film E2 is exposed by the width of field plate electrode 240 to be formed. Specifically, second photoresist film E2 is exposed using a mask so that the width of field plate electrode 240 is in the range of 0.5 to 1.5 µm and in this case, UV (I-line, 365 nm) may be used as an exposure light source. Thereafter, a part of insulating film 230 is exposed by removing second photoresist film E2 through a shape inversion baking process, and whole surface exposure and development processes (see c-2) of FIG. 4). Herein, a shape inversion backing temperature is in the range of 111 to 114° C., preferably 113° C. and a shape inversion baking time is in the range of 2 to 4 minutes, preferably 3 minutes.

Thereafter, metals M1, M2, and M3 for the field plate electrode are deposited on the exposed part of insulating film 230 and unremoved portion of second photoresist film E2 (see c-3) of FIG. 4). In this case, as the method for depositing field plate electrode metals M1, M2, and M3, the method known in the art is not particularly limited, but an electron beam vacuum deposition method may be used. Further, if the field plate electrode metals are also used in the art, the metals are not particularly limited, but metals composed of Ni/Au may be used.

Next, by removing the unremoved portion of second photoresist film E2 and field plate electrode metals M1 and M3 deposited thereon through a lift-off process, field plate electrode 240 is formed (see c-4) of FIG. 4).

Meanwhile, when field plate electrode 240 is formed, insulating film 230 is dry-etched and an outer profile is formed by a first photoresist film E1 of a triple layer and thereafter, deposited by electron beams to form a gate electrode 250 contacting field plate electrode 240 (see d) of FIG. 3). Specifically, an outer profile of a first support part 251 of gate electrode 250 is first formed and thereafter, outer profiles of a second support part 252 and a head part 253 are formed and the formed outer profiles are vacuum deposited to form gate electrode 250. It will be described below with reference to FIG. 5.

Figure 5:
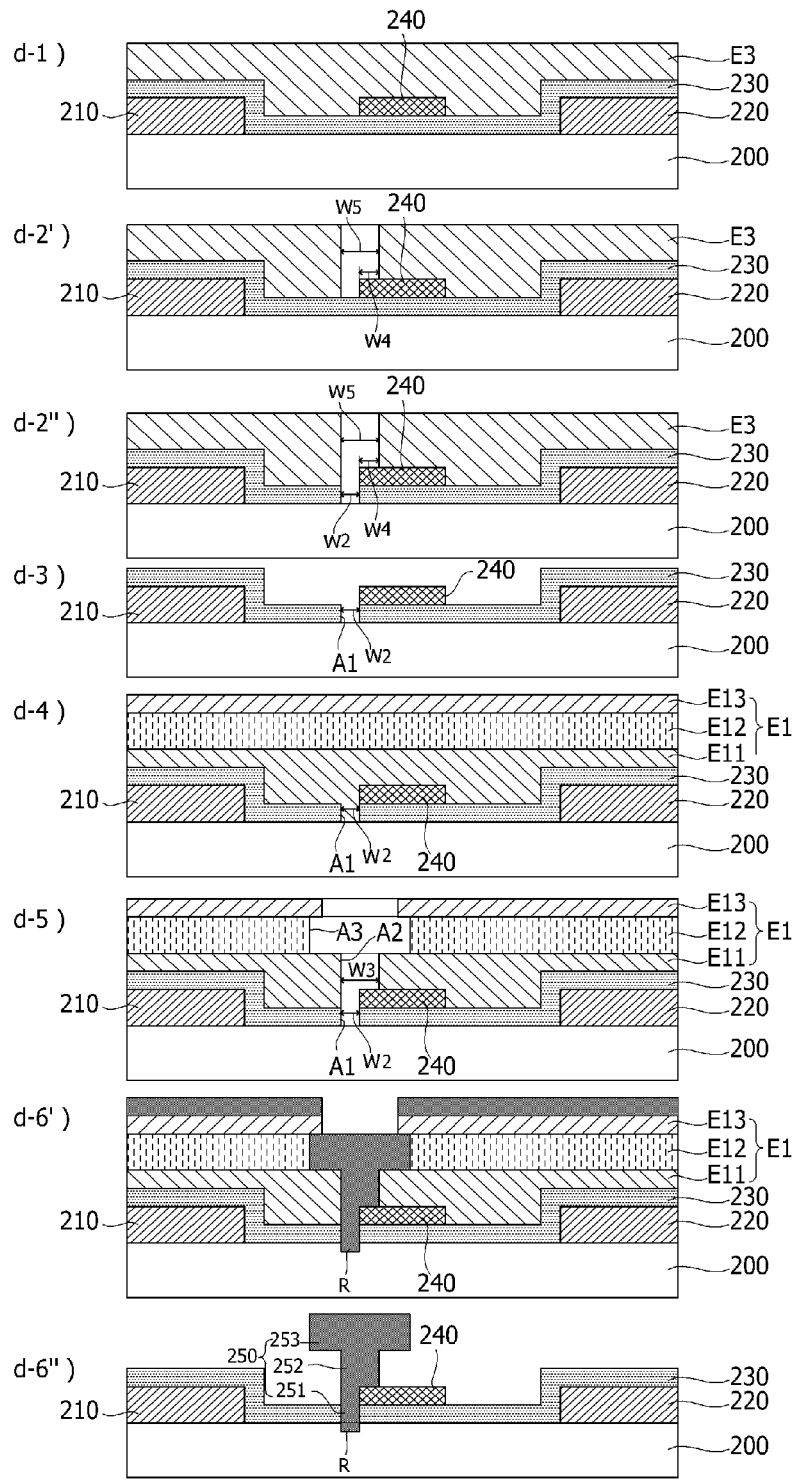
FIG. 5 is a process diagram showing a manufacturing process of a gate electrode of a semiconductor device according to an exemplary embodiment of the present disclosure.

FIG. 5 is a process diagram showing a manufacturing process of gate electrode 250 of the semiconductor device according to an exemplary embodiment of the present disclosure. A third photoresist film E3 of a single layer is first applied onto insulating film 230 with field plate electrode 240 in order to form the outer profile of first support part 251 of gate electrode 250 (see d-1) of FIG. 5). In this case, a material which can be used as third photoresist film E3 is not particularly limited, but poly methyl methacrylate (PMMA) may be used and an applied thickness is preferably in the range of approximately 4000 to 5000 Å.

Next, a portion of third photoresist film E3 is removed through the baking process, and the exposure and development processes using the electron beams to expose only a part of insulating film 230 to be etched (see d-2') of FIG. 5). In this case, third photoresist film E3 is removed to expose even field plate electrode 240 and the width W4 of field plate electrode 240 exposed by removing third photoresist film E3 may be in the range of 0.15 to 0.2 µm. Further, third photoresist film E3 removed to expose insulating film 230 may be removed as a width W5 in the range of 0.3 to 0.4 µm. As described above, when field plate electrode 240 is exposed as the width W4 in the range of 0.15 to 0.2 µm and when third photoresist film E3 is removed as the width W5 in the range of 0.3 to 0.4 μm, it is advantageous in forming first support part 251 having minute pattern width W2.

Thereafter, the insulating film 230 is anisotropically etched using the unremoved portion of photoresist film E3 and field plate electrode 240 as an etching mask (see d-2") of FIG. 5). The method for etching insulating film 230 is not particularly limited, but a dry etching method including reactive ion etching capable of preventing a pattern width from increasing is preferably used.

Insulating film 230 is etched to have minute pattern width W2 in the range of 0.1 to 0.25 μm, and as a result, first support part 251 of gate electrode 250 is formed to have minute pattern width W2 in the range of 0.1 to 0.25 μm. Meanwhile, overetching is preferably performed so as to prevent etched insulating film 230 from remaining on substrate 200.

Next, outer profile A1 of first support part 251 of gate electrode 250 is formed by removing third photoresist film E3 that is remaining and not etched (see d-3) of FIG. 5). In this case, a plasma ashing process may be additionally performed so as to fully remove third photoresist film E3.

Thereafter, first photoresist film E1 of a triple layer is applied on insulating film 230 where the outer profile of first support part 251 is formed in order to form the outer profiles of second support part 252 and head part 253 of the gate electrode 250 (see d-4) of FIG. 5). A photoresist film E11 positioned in the lowermost portion in first photoresist film E1 of the triple layer is to form the outer profile of second support part 252 of gate electrode 250 and has a thickness corresponding to the height of second support part 252 and a photoresist film E12 thereon is to form head part 253 of gate electrode 250 and has a thickness corresponding to the height of head part 253. Further, an uppermost photoresist film E13 is to facilitate a lift-off process and has a predetermined thickness. Specifically, first photoresist film E1 including lowermost photoresist film E11 with a thickness of 4500 Å, photoresist film E12 thereon with a thickness of 10000 Å, and uppermost photoresist film E13 with a thickness of 1500 Å may be used. Further, lowermost and uppermost photoresist films E11 and E13 in first photoresist film E1 are preferably PMMA and middle first photoresist film E12 is preferably a co-polymer.

Meanwhile, when first photoresist film E1 is applied, outer profiles A1 and A3 of second support part 252 and head part 253 connected with first support part 251 of gate electrode 250 are formed by removing a part of first photoresist film E1 through baking, electron beam radiation, and development processes (see d-5) of FIG. 5). In this case, lowermost photoresist film E11 in first photoresist film E1 is removed as width W3 larger than width W2 of first support part 251 such that the width of second support part 252 is larger than that of first support part 251. Specifically, lowermost photoresist film E11 in first photoresist film E1 may be removed as width W3 in the range of 0.6 to 0.7 μm.

Thereafter, the gate electrode metal is vacuum-deposited on the outer profiles of first support part 251, second support part 252, and head part 253 by the electron beams (see d-6') of FIG. 5) and remaining first photoresist film E1 is removed by performing the lift-off process, and as a result, the semiconductor device in which gate electrode 250 contacts field plate electrode 240 is manufactured (see d-6") of FIG. 5).

Meanwhile, a process for recess-etching substrate 200 by using a dry etching method using inductively coupled plasma may be additionally performed so that the outer profile of first support part 251 is formed on even substrate 200 before vacuum-depositing the gate electrode metal. Herein, gas composed of $BCl_3/Cl_2$ may be used for recess-etching substrate 200. As described above, when first support part 251 of gate electrode 250 is inserted into part R of substrate 200, a desired current can flow through source electrode 210 and drain electrode 220, thereby adjusting a threshold voltage.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for manufacturing a semiconductor device, comprising:
    forming a source electrode and a drain electrode on a substrate; forming an insulating film by depositing silicon oxide or silicon nitride on the substrate with the source electrode and the drain electrode;
    forming a field plate electrode on the insulating film; and forming a gate electrode in contact with the field electrode,
    wherein the formation of the gate electrode includes:
    applying a third photoresist film of a single layer on the insulating film with the field plate electrode;
    developing the third photoresist film so as to expose a part of each of the insulating film and the field plate electrode and etching the insulating film using the developed third photoresist film as a mask;
    forming an outer profile of a first support part by removing an unetched portion of the third photoresist film;
    applying a first photoresist film of the triple layer onto the insulating film where the outer profile of the first support part is formed;
    forming outer profiles of a second support part and a head part connected with the first support part by removing a part of the first photoresist film; and
    vacuum-depositing a gate electrode metal into a void formed by the outer profiles of the first support part, the second support part, and the head part using electron beams and removing an unremoved portion of the first photoresist film, wherein the width W3 of the second support part is larger than the width W2 of the first support part.

2. The method of claim 1, wherein the formation of the field plate electrode includes:
    applying a second photoresist film of a single layer on the insulating film;
    exposing a part of the insulating film by removing the second photoresist film as wide as the width of a field plate electrode to be formed;
    depositing a field plate electrode metal on the exposed portion of the insulating film and an unremoved second photoresist film; and
    removing the unremoved second photoresist film and the field plate electrode metal deposited thereon.

3. The method of claim 1, wherein the width W4 of the field plate electrode exposed in the development of the third photoresist film is in the range of 0.15 to 0.2 μm.

4. The method of claim 1, wherein the width W5 of the insulating film exposed in the development of the third photoresist film is in the range of 0.3 to 0.4 μm.

5. The method of claim 1, wherein the formation of the outer profiles of the second support part and the head part further includes recess-etching the substrate so that the outer profile of the first support part is formed into the substrate.

6. The method of claim 1, wherein the etching in the formation of the gate electrode includes reactive ion etching.

\* \* \* \* \*